(12) United States Patent
Kitaura et al.

(10) Patent No.: US 9,338,901 B2
(45) Date of Patent: May 10, 2016

(54) SLIDING ELECTRONIC APPARATUS

(71) Applicant: KYOCERA Corporation, Kyoto-shi, Kyoto (JP)

(72) Inventors: Hiroyuki Kitaura, Sakai (JP); Keisuke Nonaka, Osaka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/400,318

(22) PCT Filed: May 8, 2013

(86) PCT No.: PCT/JP2013/062887
§ 371 (c)(1),
(2) Date: Nov. 10, 2014

(87) PCT Pub. No.: WO2013/168725
PCT Pub. Date: Nov. 14, 2013

(65) Prior Publication Data
US 2015/0124386 A1    May 7, 2015

(30) Foreign Application Priority Data

May 10, 2012   (JP) ................................. 2012-108467

(51) Int. Cl.
*H05K 5/00* (2006.01)
*H04M 1/02* (2006.01)
*G06F 1/16* (2006.01)

(52) U.S. Cl.
CPC ............ *H05K 5/0008* (2013.01); *G06F 1/1675* (2013.01); *H04M 1/0237* (2013.01); *H05K 5/0017* (2013.01)

(58) Field of Classification Search
CPC .. H05K 5/0008; H05K 5/0017; G06F 1/1675; H04M 1/0237
USPC ............... 361/679.01, 679.26, 679.3, 679.56, 361/683, 686, 725, 728, 729, 752, 755, 800, 361/802; 455/575.4, 566
See application file for complete search history.

(56) References Cited

U.S. PATENT DOCUMENTS

| 7,716,786 B2 * | 5/2010 | Shen ......................... E05D 3/18 16/239 |
| 7,747,297 B2 * | 6/2010 | Koibuchi ............ H04M 1/0237 455/575.1 |
| 2005/0215298 A1 * | 9/2005 | Lee ..................... H04M 1/0237 455/575.4 |

(Continued)

FOREIGN PATENT DOCUMENTS

| JP | 2005-291315 A | 10/2005 |
| JP | 2006-128808 A | 5/2006 |

(Continued)

OTHER PUBLICATIONS

International Search Report dated Jun. 18, 2013 issued in counterpart Internation Application No. PCT/JP2013/062887.

*Primary Examiner* — Hoa C Nguyen
*Assistant Examiner* — Sagar Shrestha
(74) *Attorney, Agent, or Firm* — Procopio, Cory, Hargreaves & Savitch LLP

(57) ABSTRACT

A slide type electronic apparatus according to the present invention has a first body 1, a second body 2, and a slide module 3. The slide type electronic apparatus has a plurality of screws 8 whose forefront portions are screwed into a slide portion 32 of the slide module 3 through an inside of the first body 1.

1 Claim, 9 Drawing Sheets

(56) References Cited

U.S. PATENT DOCUMENTS

| | | | | |
|---|---|---|---|---|
| 2006/0176654 A1* | 8/2006 | Kfoury | ................ | G06F 1/1624 361/679.56 |
| 2008/0209683 A1* | 9/2008 | Lee | .................... | H04B 1/3816 16/352 |
| 2009/0027836 A1* | 1/2009 | Wakihara | ............ | H04M 1/0237 361/679.01 |
| 2009/0029749 A1* | 1/2009 | Lee | .................... | H04M 1/0237 455/575.4 |
| 2012/0220352 A1* | 8/2012 | Sato | ................... | H04M 1/0237 455/575.4 |

FOREIGN PATENT DOCUMENTS

| | | |
|---|---|---|
| JP | 2007-304390 A | 11/2007 |
| JP | 2011-044910 A | 3/2011 |

* cited by examiner

CROSS SECTION A-A

CROSS SECTION B-B

SLIDING ELECTRONIC APPARATUS

TECHNICAL FIELD

The present invention relates to a slide type electronic apparatus.

BACKGROUND ART

A slide type electric apparatus has a first body 9, a second body 93, and a slide module 94, as shown in FIG. 13. The first body 9 and the second body 93 are coupled to each other through the slide module 94. The slide module 94 includes a base portion 95 and a slide portion 96, which are slidably coupled to each other. The slide portion 96 is coupled to the first body 9, and the base portion 95 is coupled to the second body 93.

The first body 9 includes a front cabinet 91 and a back cabinet 92, which are fixed to each other by a plurality of screws 83. The front cabinet 91 is fixed to the slide portion 96 of the slide module 94 by a plurality of screws 82.

In an assembly process of the slide type electronic apparatus, in a state where the base portion 95 of the slide module 94 is fixed to the second body 93, the front cabinet 91 of the first body 9 is fixed to the slide portion 96 of the slide module 94 by the plurality of screws 82, and then, the back cabinet 92 is fixed to the front cabinet 91 by the plurality of screws 83.

However, when the slide type electronic apparatus shown in FIG. 13 is assembled, the plurality of (e.g., seven) screws 82 are required for fixing the front cabinet 91 of the first body 9 to the slide portion 96 of the slide module 94, and the plurality of (e.g., seven) screws 83 are required for fixing the back cabinet 92 to the front cabinet 91 of the first body 9. Accordingly, a total number of screws is increased, and thus it took a long time to assemble and disassemble the apparatus.

Therefore, a slide type electronic apparatus capable of reducing the number of screws required for assembly has been desired.

SUMMARY OF THE INVENTION

A slide type electronic apparatus according to one aspect of the present invention is configured by a first body, a second body, and a slide module that mutually couples the first body and the second body. The first body includes a front cabinet and a back cabinet. The slide module includes a base portion that is coupled to the second body, and a slide portion that is slidable to the base portion and is coupled to the first body. The front cabinet and the back cabinet are fixed to each other by one or a plurality of screws. The first body and the slide portion are coupled by a plurality of screws. As to the plurality of screws, forefront portions thereof are fixed to the slide portion of the slide module from a back surface side of the back cabinet through an inside of the first body.

DETAILED DESCRIPTION OF EMBODIMENTS

Hereinafter, an embodiment of the present invention will be specifically described with reference to the drawings.

Figure 1:
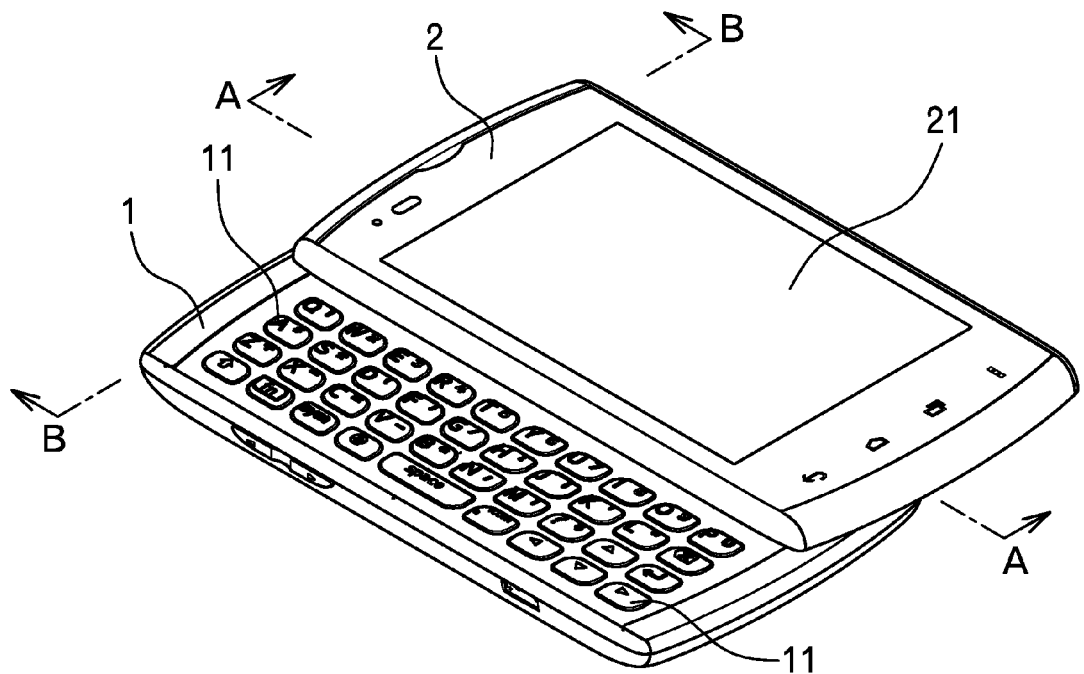
FIG. 1 is a perspective view showing a front surface side of a slide type electronic apparatus which is one embodiment of the present invention.
Figure 2:
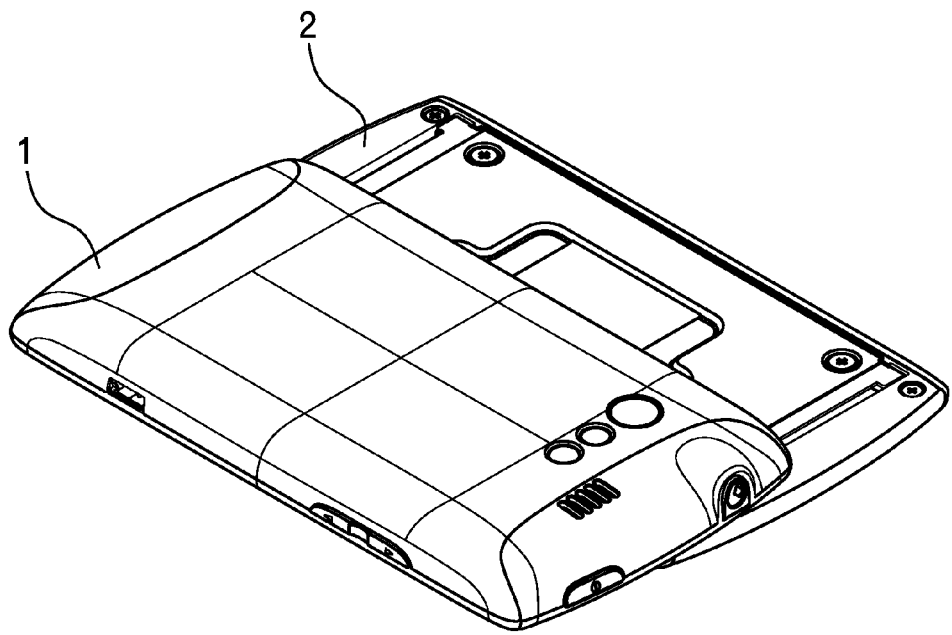
FIG. 2 is a perspective view showing a back surface side of the slide type electronic apparatus.

A slide type electronic apparatus as one embodiment of the present invention is configured by a first body 1 including a plurality of operation keys 11 on a surface thereof, and a second body 2 including a screen 21 on a surface thereof, as shown in FIGS. 1 and 2. The first body 1 and the second body 2 are slidably coupled to each other by a slide module 3 shown in FIGS. 7 and 8.

Figure 7:
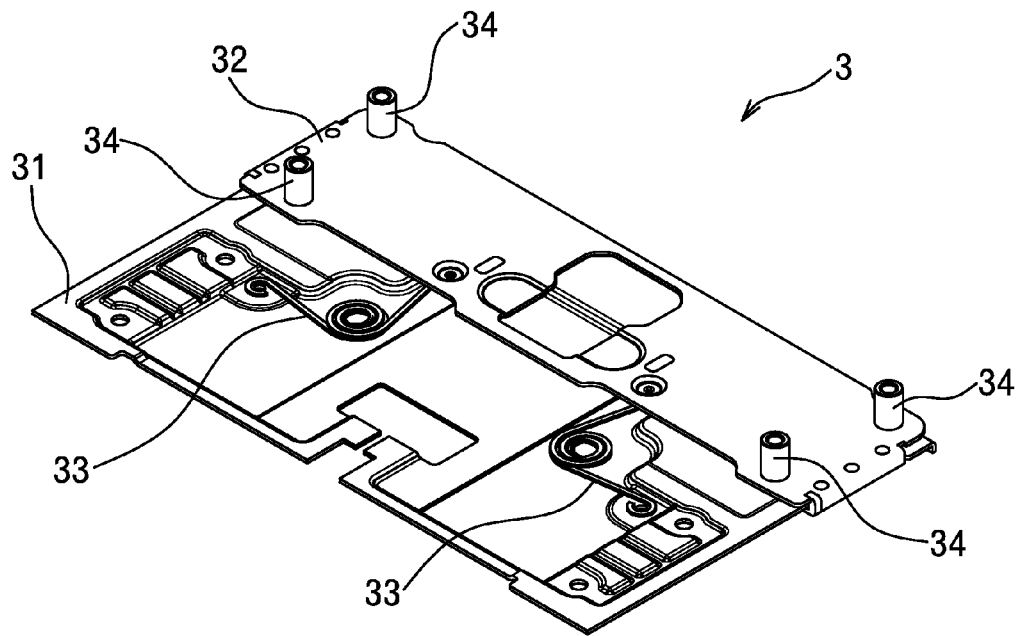
FIG. 7 is a perspective view of a slide module.
Figure 8:
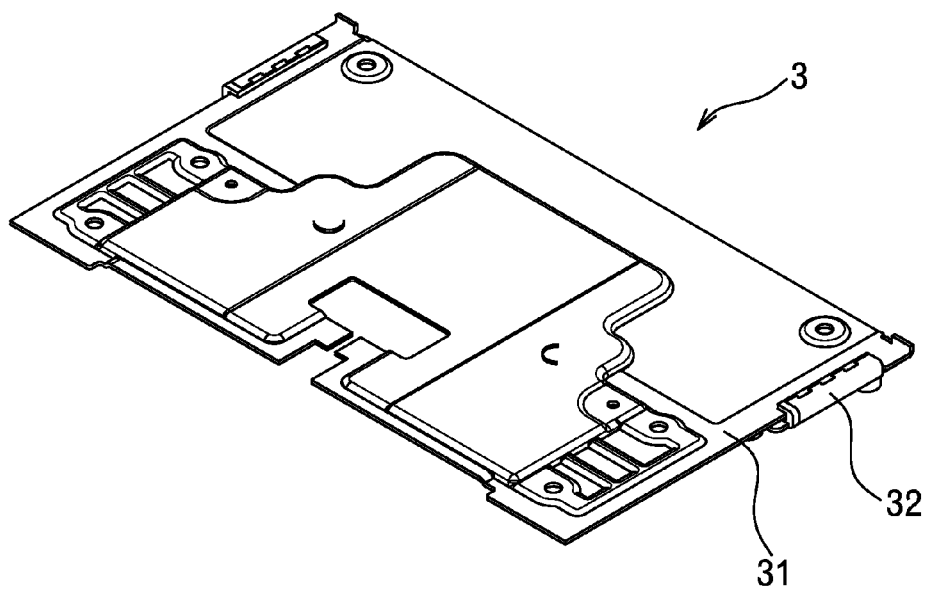
FIG. 8 is a perspective view showing a back surface side of the slide module.

As shown in FIGS. 7 and 8, the slide module 3 is configured by a tabular base portion 31, a tabular slide portion 32 slidably engaged on the base portion 31, and two springs 33, 33 intervening between the base portion 31 and the slide portion 32.

Reverse operation and elastic repulsive force of these springs 33, 33 allow the slide portion 32 on the base portion 31 to be biased along a slide direction, that is, in one slide direction or in another slide direction.

On a surface of the slide portion 32 of the slide module 3, four bosses 34 to 34 each having a cylindrical shape are provided by welding at four corner portions, respectively, as shown in FIG. 7.

Specifically, in the slide portion 32 of the slide module 3, the plurality of bosses 34 into which forefront portions of a plurality of screws 8 are screwed, respectively are projected toward an inside of the first body 1.

Figure 3:
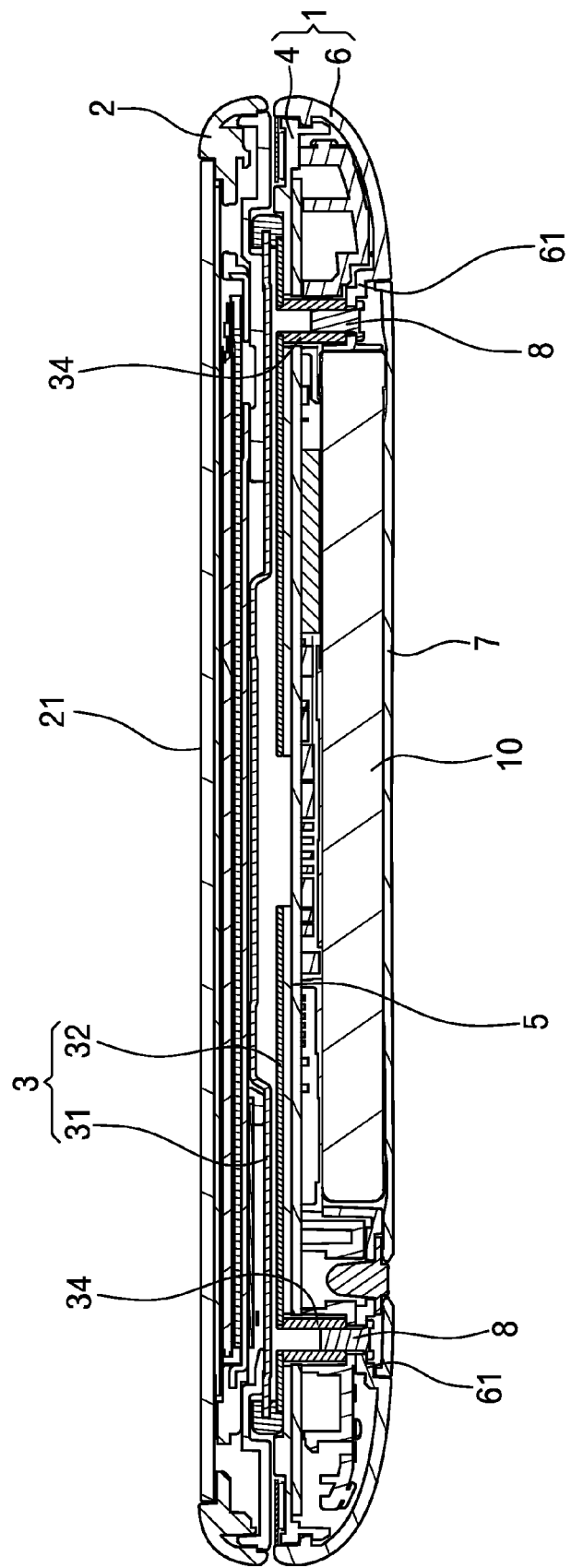
FIG. 3 is a cross-sectional view along an A-A line in FIG. 1.
Figure 4:
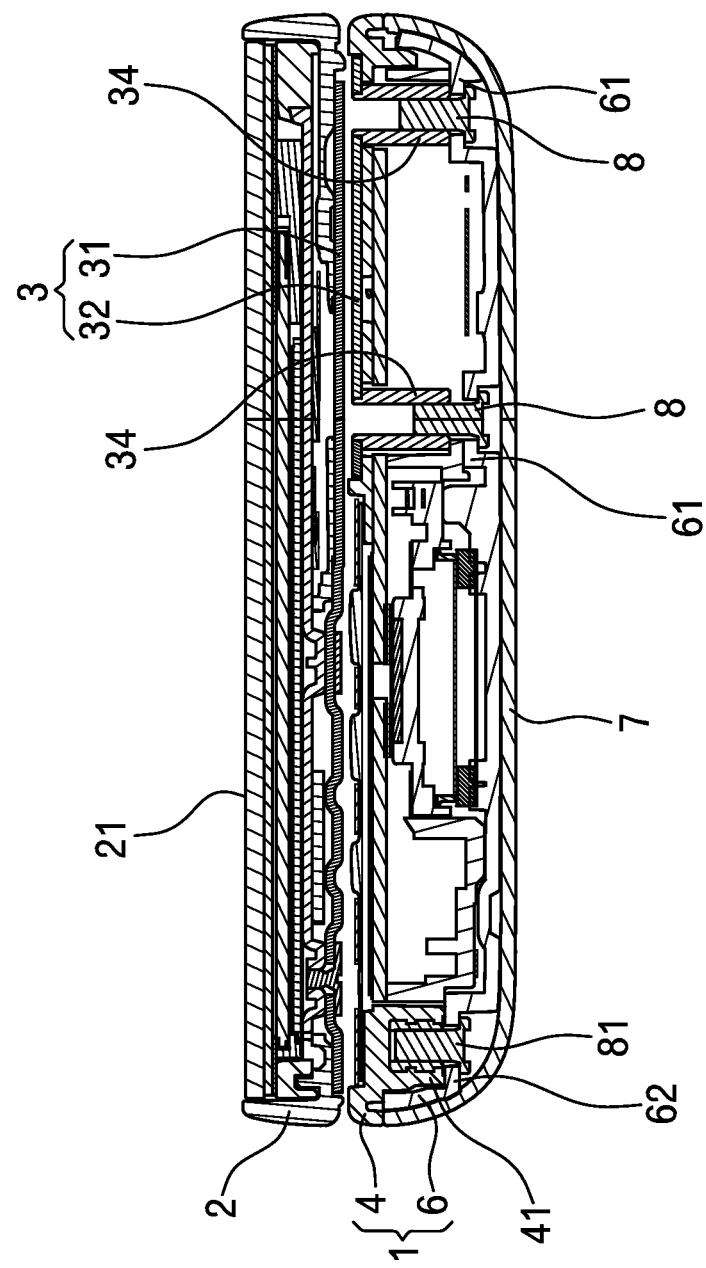
FIG. 4 is a cross-sectional view along a B-B line in a state where the electronic apparatus in an open state shown in FIG. 1 is closed.

As shown in FIGS. 3 and 4, the base portion 31 of the slide module 3 is coupled to the second body 2, and the slide portion 32 of the slid module 3 is coupled to the first body 1.

Figure 5:
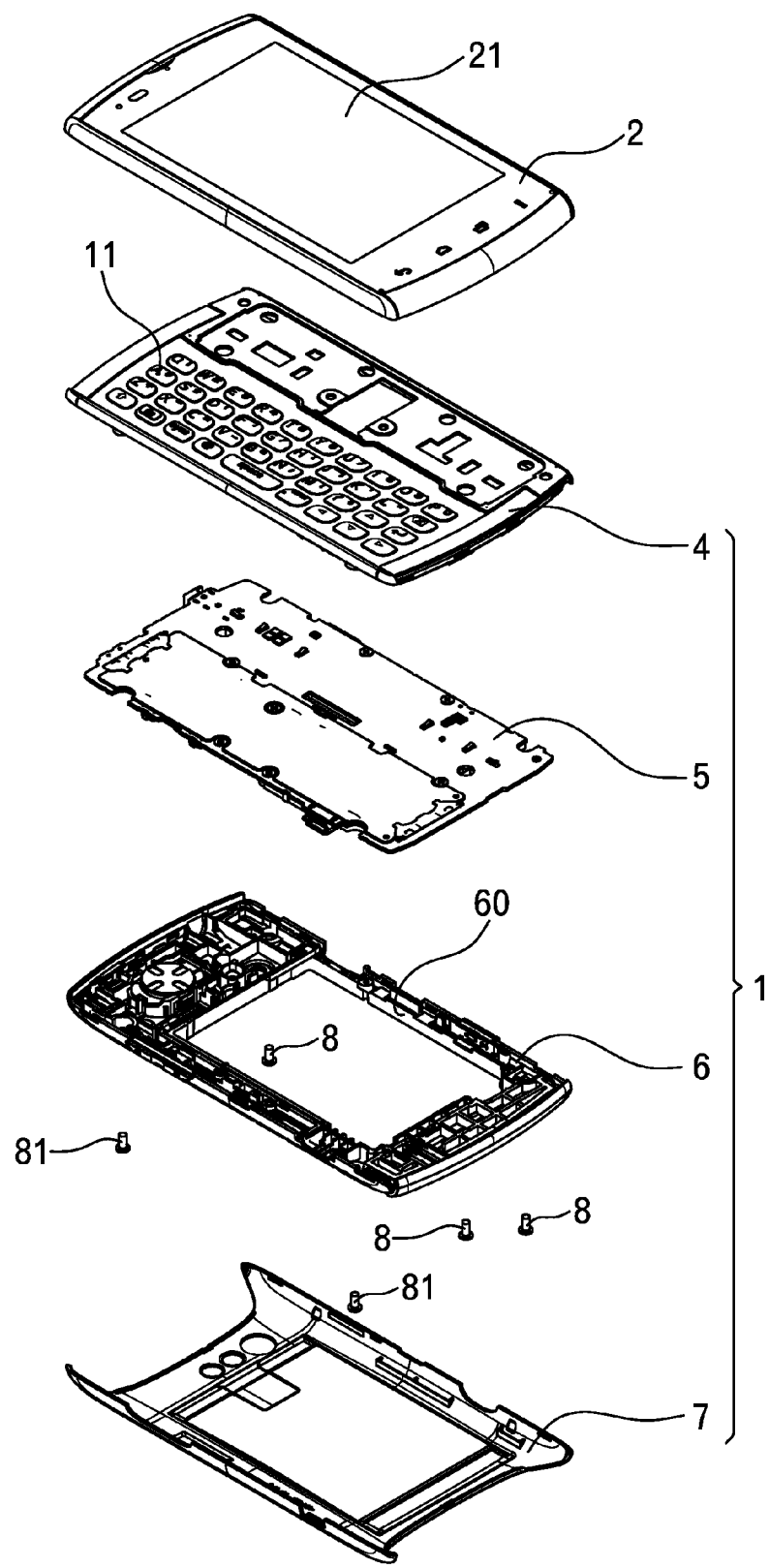
FIG. 5 is an exploded perspective view corresponding to FIG. 1 of the slide type electronic apparatus.
Figure 6:
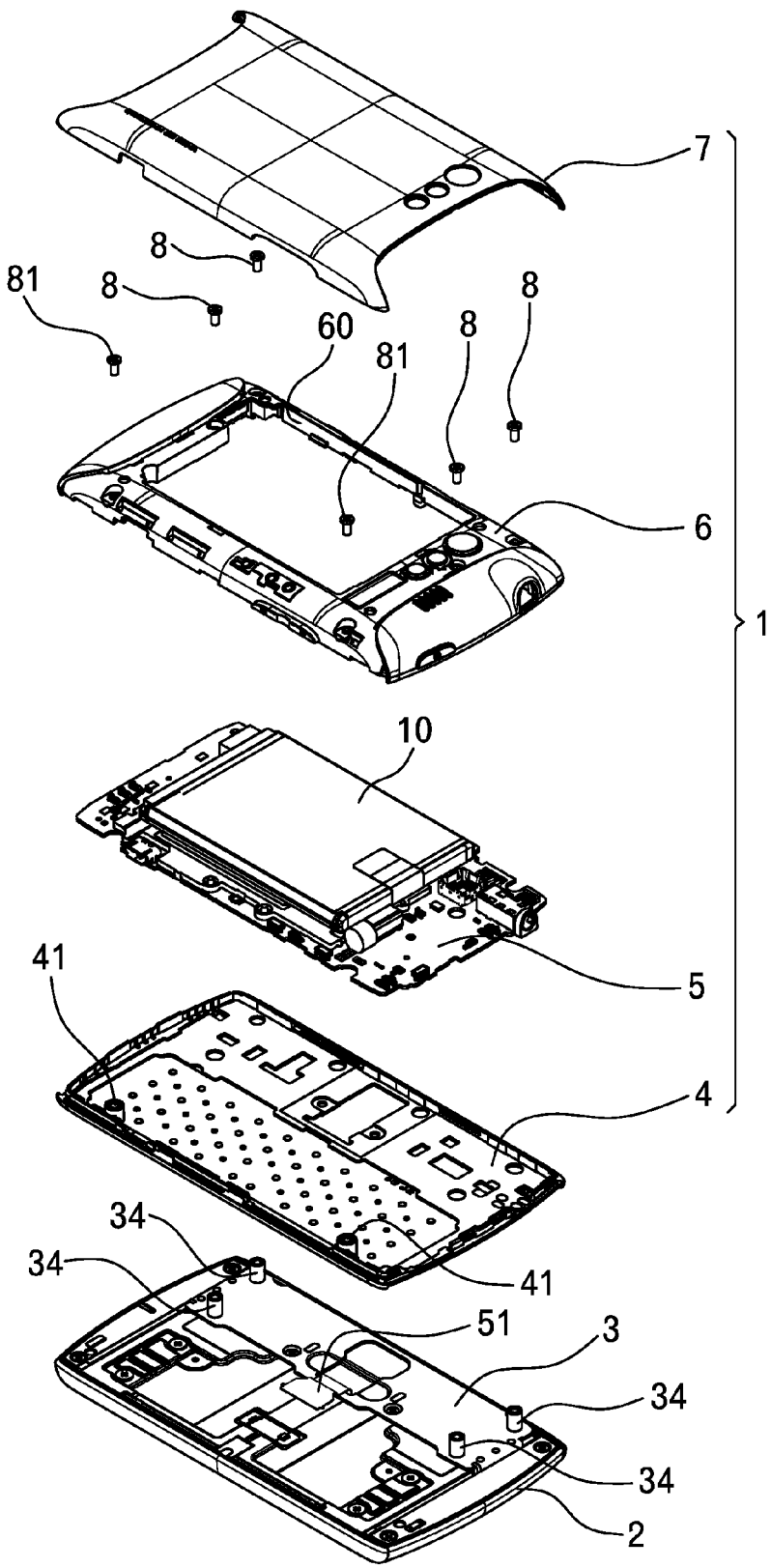
FIG. 6 is an exploded perspective view corresponding to FIG. 2 of the slide type electronic apparatus.

As shown in FIGS. 5 and 6, the first body 1 includes a front cabinet 4 provided with a plurality of operation keys 11, a back cabinet 6 having a battery containing chamber 60, a circuit board 5 contained inside both the cabinets 4, 6, and a battery lid 7 covering the battery containing chamber 60 of the back cabinet 6.

A battery 10 contained in the battery containing chamber 60 is mounted on the circuit board 5, as shown in FIG. 6.

Two screws 81, 81 shown in FIGS. 5 and 6 are used to fix the front cabinet 4 and the back cabinet 6 to each other in the first body 1.

As shown in FIG. 4, in the back cabinet 6 of the first body 1, a seat 62 in which a head of each of the screws 81 is locked is formed, and in the front cabinet 4, boss portions 41 into which the respective screws 81 are screwed are formed.

Moreover, the four screws 8 to 8 shown in FIGS. 5 and 6 are used to fix the first body 1 to the slide portion 32 of the slide module 3.

As shown in FIG. 4, in the back cabinet 6, a seat 61 in which a head of each of the screws 8 is locked is formed. Each of the seats 61 is opposed to a forefront surface of each of the bosses 34 of the slide module 3.

The four screws 8 to 8 extend through the inside of the first body 1 from a back surface side of the back cabinet 6, so that the forefront portions thereof are screwed into the four bosses 34 to 34 of the slide portion 32 of the slide module 3. Thereby, the first body 1 is coupled to the slide portion 32 of the slide module 3, and at the same time, these screws 8 exert a role of coupling the front cabinet 4 and the back cabinet 6 of the first body 1 to each other (a tightening-together effect).

Accordingly, the number of screws 81 required for fixing the front cabinet 4 and the back cabinet 6 of the first body 1 to each other can be reduced in accordance with coupling strength exerted by the plurality of screws 8.

As a result, the number of required screws is reduced, as compared with a conventional configuration where the front cabinet 4 and the back cabinet 6 of the first body 1 are fixed to each other by screws contributing to only fixing of both the cabinets.

Figure 9:
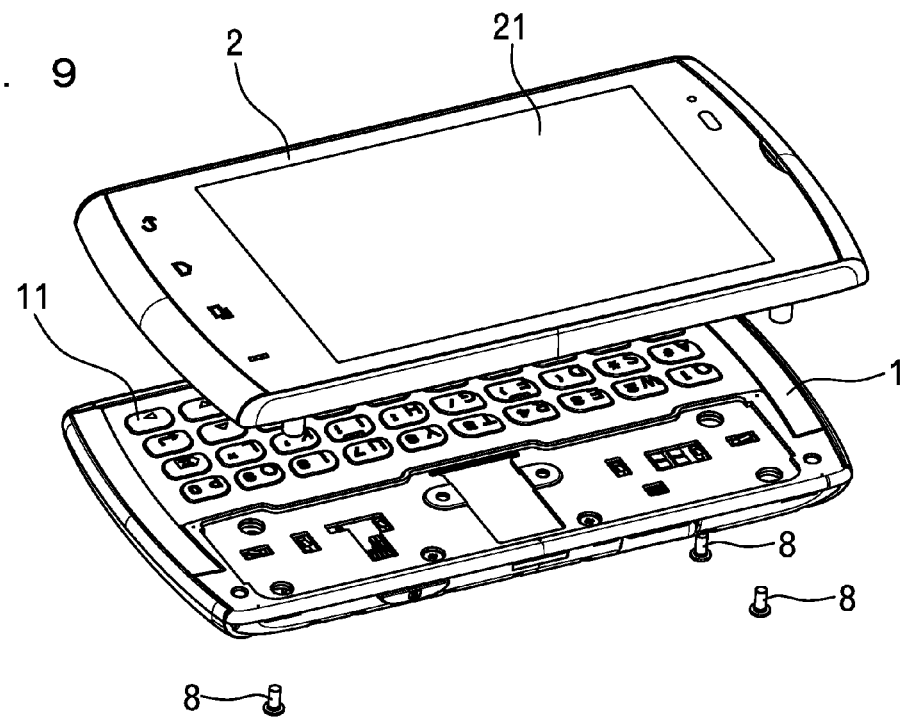
FIG. 9 is a perspective view showing a final stage of an assembly process.
Figure 10:
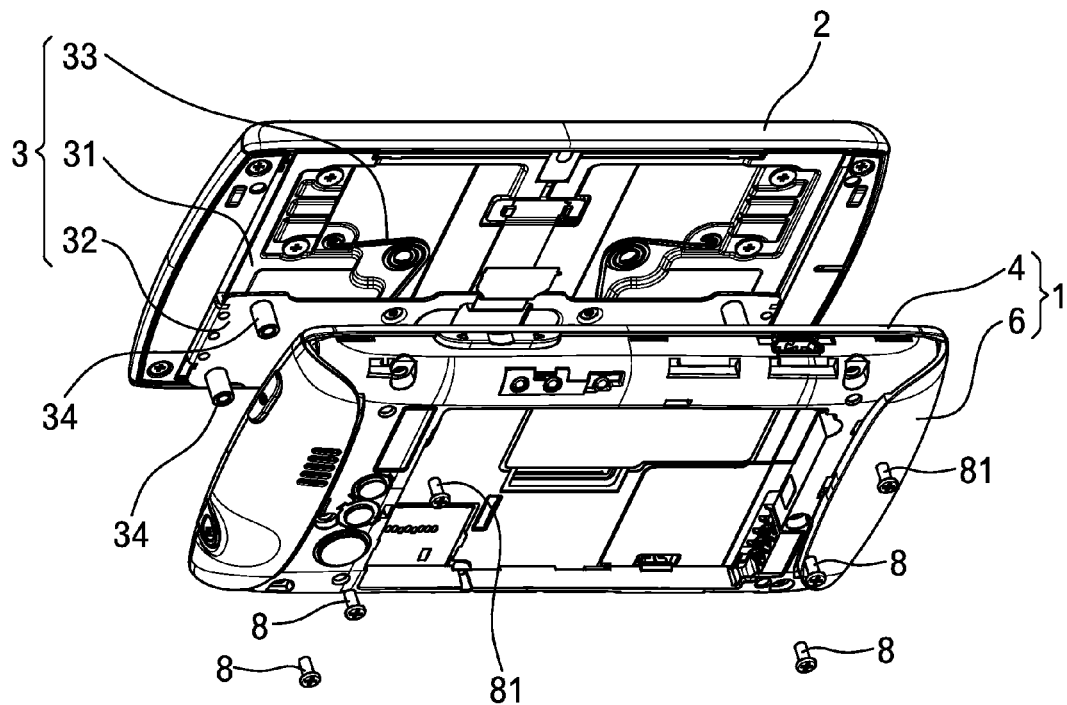
FIG. 10 is a perspective view showing the final stage when seen from a direction different from FIG. 9.
Figure 11:
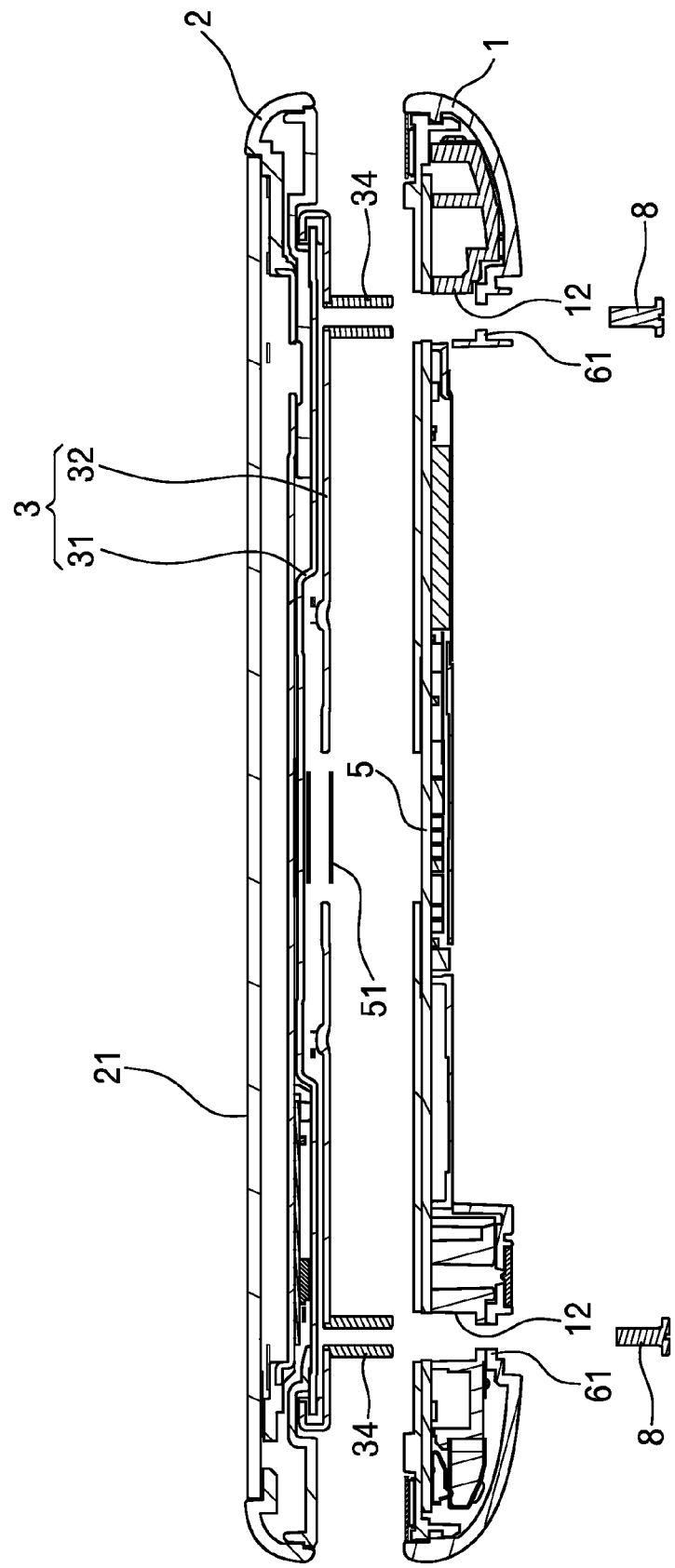
FIG. 11 is a cross-sectional view showing the final stage.
Figure 12:
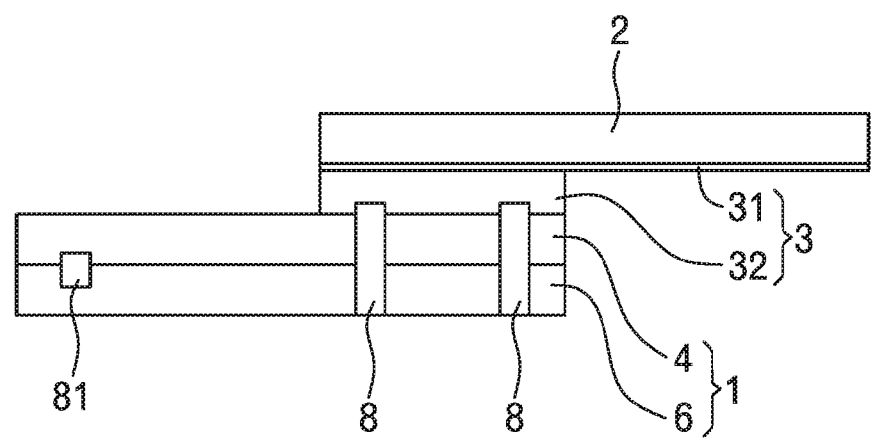
FIG. 12 is a cross-sectional view schematically showing a configuration of the slide type electronic apparatus according to the present invention.
Figure 13:
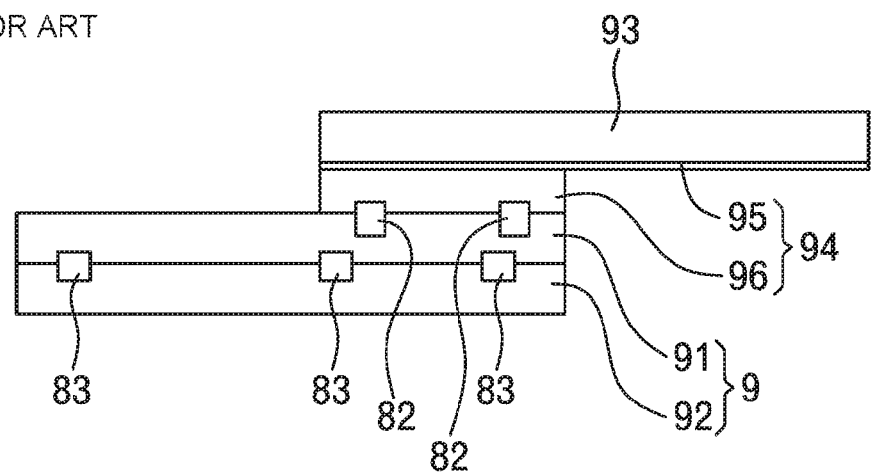
FIG. 13 is a cross-sectional view schematically showing a configuration of a conventional slide type electronic apparatus.

In an assembly process of the above-described slide type electronic apparatus, the first body 1 and the second body 2 are firstly assembled individually, as shown in FIGS. 9 to 11.

On this occasion, the base portion 31 of the slide module 3 is fixed to the second body 2. Moreover, the two screws 81, 81 are screwed into the boss portions 41 of the front cabinet 4 from the back surface side of the back cabinet 6, respectively to fix the front cabinet 4 and the back cabinet 6 to each other, as shown in FIG. 4.

Although at this stage, a fixing state of the front cabinet 4 and the back cabinet 6 by the two screws 81, 81 is insufficient because of biased distribution of fixing force, at least a fixing state where displacement between the front cabinet 4 and the back cabinet 6 is not caused is obtained.

Thereafter, the four bosses 34 to 34 of the slide module 3 fixed to the second body 2 are respectively fitted into holes 12 formed inside the first body 1, as shown in FIG. 11. Thereby, the first body 1 is positioned to the second body 2, and the forefront surfaces of the respective bosses 34 are opposed to the seats 61 formed in the back cabinet 6 of the first body 1 (refer to FIG. 3).

As a result, the first body 1 and the second body 2 are brought into a state positioned to each other through the slide module 3.

Moreover, the respective bosses 34 are provided so as to extend to the back cabinet 6 of the first body 1. This makes it unnecessary that a length extending from the heads of the screws 8 to be fitted into the respective bosses 34 is long enough to reach the second body 2, and enables normal screws (e.g., the screws 81) to be used as the screws 8.

In this state, a flexible lead 51 extending from the first body 1 is coupled to a connector (illustration is omitted) of the circuit board 5 contained in the first body 1.

Further, in this state, the four screws 8 to 8 are screwed into the four bosses 34 to 34 of the slide module 3 from the back surface side of the first body 1, respectively. This allows the first body 1 to be fixed to the slide portion 32 of the slide module 3, as shown in FIGS. 3 and 4.

At the same time, by tightening force of the four screws 8 to 8, the front cabinet 4 and the back cabinet 6 of the first body 1 are tightened together, and both the cabinets 6, 4 are brought into a state fixed to each other by sufficient force combined with tightening force by the two screws 81, 81.

According to the above slide type electronic apparatus, only a total of six screws, that is, the two screws 81, 81 contributing to only fixing of both the cabinets 4, 6, and the four screws 8 screwed into the bosses 34 of the slide module 3 from the back surface side of the first body 1 are used to fix the front cabinet 4 and the back cabinet 6 of the first body 1 to each other.

In contrast, as in the conventional art, in the structure where the front cabinet 4 and the back cabinet 6 of the first body 1 are fixed only by the screws contributing to only the fixing of both the cabinets 4, 6, at least four screws are required for fixing the front cabinet 4 and the back cabinet 6 of the first body 1 to each other, and in addition, at least four screws are required for coupling the first body 1 to the slide portion 32 of the slide module 3.

In this manner, according to the above slide type electronic apparatus, a total number of the bosses required for assembly can be reduced as compared with that in the conventional art.

This can reduce a number of processes required for assembly/disassembly of the apparatus can be reduced, thereby enabling reduction in a manufacturing cost.

Moreover, the number of screws penetrating the circuit board 5 which is built in the first body 1 can be reduced as compared with that in the conventional art, which can expand a mounting area of the circuit board 5.

Note that the configurations of the respective components of the present invention are not limited to the above-described embodiment, but various modifications can be made within a technical range described in claims. For example, the number of screws used in the assembly is not limited to the above-described example.

Moreover, the coupling relationship of the base portion 31 and the slide portion 32 of the slide module 3 with the first body 1 and the second body 2 is not limited to the above-described configuration, but a configuration can be employed, in which the base portion 31 is coupled to the first body 1, and the slide portion 32 is coupled to the second body 2.

DESCRIPTION OF REFERENCE CHARACTERS

1. first body
2. second body
3. slide module
31. base portion
32. slide portion
34. boss
4. front cabinet
6. back cabinet
8. screw
81. screw

The invention claimed is:

1. A slide type electronic apparatus comprising:
a first body having a front cabinet and a back cabinet;
a second body;
a slide module that couples the first body and the second body, the slide module having a base portion that is coupled to the second body, and a slide portion that is slidable to the base portion and is coupled to the first body; and
a plurality of screws whose forefront portions are fixed to the slide portion from a back surface side of the back cabinet through an inside of the first body,
wherein the slide portion has a plurality of bosses into which the forefront portions of the plurality of screws are screwed, respectively, the plurality of bosses being projected toward the inside of the first body, wherein the back cabinet has a plurality of seats in which heads of the plurality of screws are locked, and wherein the bosses of the slide module each penetrate the front cabinet of the first body and extend up to an opposed position to each of the seats.

* * * * *